(12) United States Patent
Wasserstrom

(10) Patent No.: US 11,392,450 B1
(45) Date of Patent: Jul. 19, 2022

(54) DATA INTEGRITY CHECK FOR ONE-TIME PROGRAMMABLE MEMORY

(71) Applicant: Amazon Technologies, Inc., Seattle, WA (US)

(72) Inventor: Barak Wasserstrom, Mitzpe Aviv (IL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/247,293

(22) Filed: Dec. 7, 2020

(51) Int. Cl.
*G06F 11/10* (2006.01)
*H03M 13/09* (2006.01)
*G06F 12/02* (2006.01)

(52) U.S. Cl.
CPC ........ *G06F 11/1004* (2013.01); *G06F 12/023* (2013.01); *H03M 13/09* (2013.01); *G06F 2212/251* (2013.01)

(58) Field of Classification Search
CPC ............... G06F 11/1004; G06F 12/023; G06F 2212/251; H03M 13/09
USPC ........................................................ 714/758
See application file for complete search history.

(56) References Cited

U.S. PATENT DOCUMENTS

| 8,245,102 | B1* | 8/2012 | Cory ..................... H03M 13/27 714/753 |
| 8,472,233 | B1* | 6/2013 | Krishnamoorthy .... G11C 17/18 365/96 |
| 2003/0217322 | A1* | 11/2003 | Rodgers .............. G06F 11/1068 714/763 |
| 2004/0015667 | A1* | 1/2004 | Bushner .............. G06F 11/1008 711/163 |
| 2013/0044538 | A1* | 2/2013 | Oh ...................... H01L 27/0688 365/158 |
| 2014/0032813 | A1* | 1/2014 | Liu ..................... G06F 11/1012 711/103 |
| 2014/0244991 | A1* | 8/2014 | Akdemir ............... G06F 9/4401 713/2 |
| 2020/0104221 | A1* | 4/2020 | Kost ...................... G11C 29/52 |
| 2020/0371872 | A1* | 11/2020 | Fuller ................... G11C 29/52 |
| 2021/0042188 | A1* | 2/2021 | Chen ................... G06F 11/1048 |
| 2021/0058237 | A1* | 2/2021 | Sandberg ............... G06F 21/85 |

* cited by examiner

*Primary Examiner* — Guy J Lamarre
(74) *Attorney, Agent, or Firm* — Weaver Austin Villeneuve & Sampson LLP

(57) ABSTRACT

A one-time programmable (OTP) memory can be programmed over a number of programming sessions in which each programming session writes a different portion of the memory. To provide the OTP memory with data integrity check capability, the OTP memory stores multiple error detection code entries. With each programming session, a new error detection code is stored in a previously unused entry. When the OTP memory is read, the error detection code corresponding to the latest programming session is used to verify the content of the OTP memory.

20 Claims, 11 Drawing Sheets

DATA INTEGRITY CHECK FOR ONE-TIME PROGRAMMABLE MEMORY

BACKGROUND

A one-time programmable (OTP) memory is a type of non-volatile memory in which the data bits can be programmed only once (e.g., from a default logic zero to a logic one only once, or from a default logic one to a logic zero only once). An OTP memory can be implemented, for example, by incorporating an electronic fuse (e-fuse) (e.g., made of polysilicon or metal) into each memory cell. A data bit is programmed by applying a high voltage to the memory cell. The high voltage causes electromigration of the e-fuse material to open or blow out the connection. An OTP memory can also be implemented, for example, by incorporating an anti-fuse (e.g., thin layer of oxide) into the memory cell. Similar to e-fuse implementations, programming is achieved by applying a high voltage to the memory cell. The high voltage causes the thin oxide to breakdown to establish an electrical connection through the oxide layer.

BRIEF DESCRIPTION OF THE DRAWINGS

Various embodiments in accordance with the present disclosure will be described with reference to the drawings, in which.

DETAILED DESCRIPTION

Figure 1:
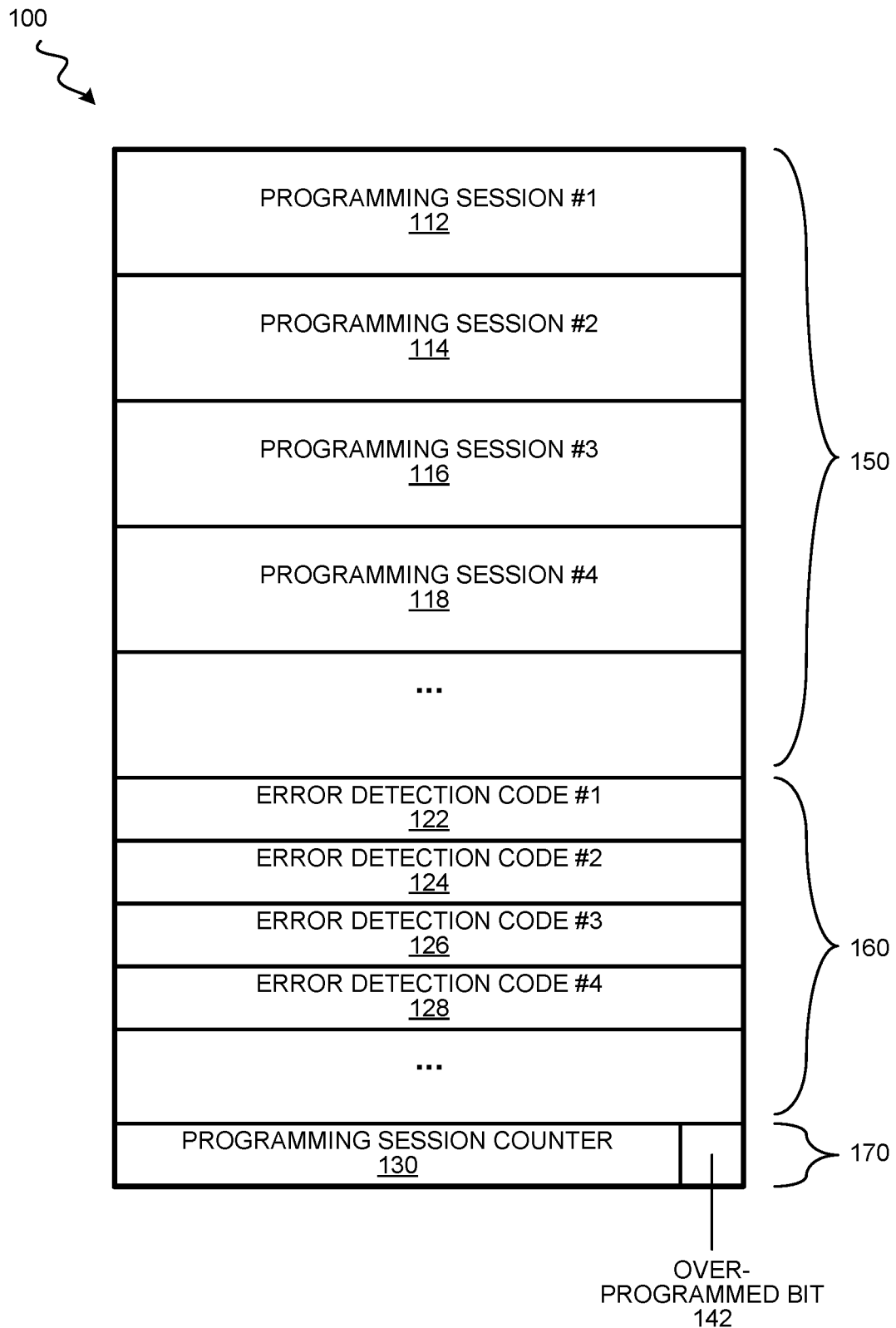
FIG. 1 illustrates a block diagram of an example of a one-time programmable (OTP) memory.

An OTP memory can be programmed over a number of programming sessions in which each programming session writes a different portion of the memory. This can be useful in situations where different entities program the OTP memory, such as when different entities involved in the manufacturing cycle of a system-on-a-chip (SoC) are tasked with programming the OTP memory of the SoC. By way of example, a semiconductor foundry may program the OTP memory with a part number and manufacturing date, a semiconductor packaging provider may program the OTP memory with a serial number, an original equipment manufacturer (OEM) may program the OTP memory with a media access control (MAC) address, etc.

A data bit in the OTP memory can be flipped unintentionally due to aging or other physical conditions. For example, environmental conditions (e.g., excessive temperature) over time may cause electromigration to regrow a previously blown e-fuse. As another example, untimely power cycling may cause an unexpected voltage spike to inadvertently program a data bit. Memory bit errors can be detected by using error detection codes such as cyclic redundancy check (CRC) values, but simply burning an error detection code onto the OTP memory may not suffice in scenarios in which the OTP memory is programmed over a number of programming sessions. Given that the OTP memory is programmed over a number of programming sessions, the content of the programmable space of the OTP memory and thus the error detection code of the memory will change with each programming session. However, once an error detection code has been programmed onto the OTP memory, the error detection code cannot be modified due to the one-time programmable nature of the memory.

The techniques disclosed herein can be used to provide data integrity check for an OTP memory that is programmed over a number of programming sessions. To achieve this, the OTP memory includes a first set of data bits that is configured to store user programmable data, and a second set of data bits that is configured to store a number of error detection code entries being equal to the number of programming sessions. In other words, the OTP memory provides each programming session with its own error detection code entry. The OTP memory may also include a third set of data bits that is configured to store a counter value indicating the number of sessions that the OTP memory has been programmed.

For each programming session of the OTP memory, input data is stored in an unwritten portion of the first set of data bits, and an error detection code (e.g., a cyclic redundancy check (CRC) value) computed over the first set of data bits for the corresponding programming session is stored in an unused error detection code entry in the second set of data bits. By providing multiple error detection code entries, a new error detection code can be stored in the OTP memory for each programming session. The counter value in the third set of data bits can also be incremented for each programming session to track how many sessions that the OTP memory has been programmed.

By implementing such content in the OTP memory, data integrity of the OTP memory can be determined by reading the first set of data bits to retrieve the programmable data, reading the counter value to determine the number of sessions that the OTP memory has been programmed, and reading an error detection code (e.g., stored CRC value) in the error detection code entry corresponding to the number of sessions that the OTP memory has been programmed. The OTP memory can be deemed error-free by computing a verification error detection code from the first set of data bits read from the OTP memory, and determining that the computed verification error detection code matches the error detection code read from the OTP memory. This would verify that the stored error correction code (e.g., stored CRC value) is computed over the first set of data bits read from the OTP memory.

FIG. 1 illustrates a block diagram of an example of an OTP memory 100, according to some implementations. OTP memory 100 can be, for example, a 4-kilobit memory, an 8-kilobit memory, or a memory of a different capacity. OTP memory 100 may include a first set of data bits 150, a second set of data bits 160, and a third set of data bits 170. The first set of data bits 150 is configured to store programmable data that may be programmed over a number of programming sessions. For example, the first set of data bits 150 may include a first portion 112 that is programmed during a first programming session, a second portion 114 that is programmed during a second programming session, a third portion 116 that is programmed during a third programming session, a fourth portion 118 that is programmed during a fourth programming session, etc. OTP memory 100 can be programmed over a number of programming sessions because different entities may be tasked with programming OTP memory 100. This may occur, for example, during the manufacturing of a system-on-a-chip (SoC) device in which different entities may have control over specific information being stored on OTP memory 100.

Information that can be stored in the programmable data space of OTP memory 100 (e.g., the first set of data bits 150) may include manufacturing information, unique device information, and/or hardware configuration information. Examples of entities that may be tasked with programming OTP memory 100 may include a semiconductor foundry, a semiconductor packing provider, an OEM, a system provider, and/or an application provider. By way of example, a semiconductor foundry that fabricated OTP memory 100 may program the first portion 112 of the first set of data bits 150 with a part number, a revision number, and a manufacturing date. A semiconductor packaging provider may program the second portion 114 of the first set of data bits 150 with a serial number. An OEM may program the third portion 116 of the first set of data bits 150 with a MAC address. A system provider that integrates OTP memory 100 into a SoC, or an application provider that installs software onto the SoC may program the fourth portion 118 of the first set of data bits 150 with a cryptographic key that is used to encrypt sensitive data stored by the SoC and/or communications transmitted by the SoC. The information stored in OTP memory 100 can be used, for example, to authenticate the firmware or bootcode of the SoC. It should be understood that these are just examples, and that the specific examples of information mentioned above can be programmed onto OTP memory by a different entity. Furthermore, other types of information can be programmed onto OTP memory by any of the entities mentioned above and/or by other entities not specifically mentioned, and that an entity may be tasked with programming the OTP memory more than one programming session.

The second set of data bits 160 in OTP memory 100 is configured to store multiple error detection code (EDC) entries. Each EDC entry is configured to store an error detection code computed over the first set of data bits 150 for a corresponding programming session. Thus, the number of EDC entries allocated in OTP memory 100 can be equal to the number of programming sessions expected for OTP memory 100. For example, EDC entry 122 can be used to store a ECC computed over the first set of data bits 150 when portion 112 is programmed, EDC entry 124 can be used to store a ECC computed over the first set of data bits 150 when portion 114 is programmed, EDC entry 126 can be used to store a ECC computed over the first set of data bits 150 when portion 116 is programmed, EDC entry 128 can be used to store a ECC computed over the first set of data bits 150 when portion 118 is programmed, and so on. The error detection code can be a CRC value (e.g., 4-bit CRC), a checksum value, a hash value, an error correction code (e.g., Hamming code), or other types of unique values computed over the first set of data bits 150. In some implementations, the number of EDC entries provided in OTP memory can be greater than the number of expected programming sessions to provide one or more spare EDC entries in case the OTP memory is programmed more than the expected number of programming sessions.

It should be noted that each of the error detection code is computed over the entire set of data bits 150. In other words, each of the error detection codes stored in OTP memory 100 is computed over the same set of data bits 150, though each error detection code is computed at different points in time. Hence, unlike memory architectures in which different error detection code entries protect different portions of the memory, each of the multiple EDC entries in the second set of data bits 160 of OTP memory 100 is protecting the same set of data bits 150.

The third set of data bits 170 in OTP memory 100 is configured to store a counter value in a programming session counter 130. The counter value represents the number of sessions that OTP memory 100 has been programmed. The counter value is incremented for each programming session to track how many sessions that the OTP memory has been programmed. This information can be used to identify which of the EDC entries is the most updated entry containing the proper error correction code for verification of the data integrity of the programmable data. In some implementations, the counter value can be implemented using a number of counter data bits being equal to the number of programming sessions. In other words, programming session counter 130 can be implemented using the same number of data bits as the number of programming sessions expected for OTP memory 100.

By way of example, if OTP memory 100 is expected to be programmed over twelve programming sessions, programming session counter 130 may include twelve counter data bits in which one bit is set or programmed per programming session. The counter value can be incremented each time OTP memory 100 is programmed by setting an additional data bit in programming session counter 130. In implementations in which programming a data bit sets the logic value of the data bit from a logic zero to a logic one, the counter value may represent the number of sessions that OTP memory 100 has been programmed as $(2^n-1)$, where n is the number of sessions that OTP memory 100 has been programmed. Thus, when OTP memory 100 has been programmed over one session, one data bit in programming session counter 130 will be set to a logic one to yield a counter value of 1; when OTP memory 100 has been programmed over two sessions, two data bits in programming session counter 130 will be set to a logic one to yield a counter value of 3; when OTP memory 100 has been programmed over three sessions, three data bits in programming session counter 130 will be set to a logic one to yield a counter value of 7, and so on. In other implementations, the counter value can represent the number of sessions that OTP memory 100 has been programmed in a different manner, so long as incrementing the counter value does not require a previously programmed data bit in programming session counter 130 to be modified.

In some implementations, OTP memory 100 may additionally include an optional invalidation bit 142. The invalidation bit 142 can be part of the third set of data bits 170, be implemented as an overflow bit in programming session counter 130, or be located elsewhere in OTP memory 100. In some scenarios, it's possible that a particular OTP memory may be subjected to more programming sessions than expected. In such scenarios, the number of sessions that the OTP memory has been programmed may exceed the number of EDC entries available in the OTP memory. If such a situation occurs, the invalidation bit 142 can be set to indicate that the EDC entries stored in OTP memory 100 cannot be relied upon to verify the data integrity of OTP memory 100, because the number of sessions that OTP memory 100 has been programmed exceeds the number of EDC entries. In some implementations, the invalidation bit 142 can also be set if a memory error has been detected in OTP memory 100 (e.g., when a computed error correction code mismatches the stored value). Thus, the invalidation bit 142 provides a mechanism to indicate whether data integrity of OTP memory 100 is verifiable by using the error detection code entries. In other words, the invalidation bit 142 can be used to indicate whether the contents of OTP memory 100 can be trusted.

OTP memory 100 can be accessed by firmware, bootcode, or other software (e.g., operating system, hypervisor, software application, etc.) to obtain identifying information of the system such as a serial number or MAC address, and/or to obtain hardware configuration information to set up the hardware behavior of the system. The information stored in OTP memory 100 can also be used to authenticate a component of the system (e.g., by using a stored cryptographic key to exchange cryptographic data). To ensure data integrity of OTP memory 100, software or components accessing OTP memory 100 can use the EDC entries to verify that the content of OTP memory 100 has not been altered. In some implementations, the data integrity check can also be performed by each successive programming entity during programming of OTP memory 100 to ensure the data programmed by prior programming sessions have not been altered.

In some implementations, the software program performing the data integrity check of OTP memory 100 can be hardcoded with the location (e.g., memory address) of the various data elements stored in OTP memory 100. In some implementations, the software program can maintain a mapping of version numbers to data element locations to support different version of OTP memory 100. For example, a version number can be stored in OTP memory 100, and the software program can read the version number and obtain the data element locations based on the version number. In some implementations, the locations of certain data elements such as the location of the EDC entries can also be stored in OTP memory 100 itself.

To verify the data integrity of OTP memory 101, a software program can read the first set of data bits 150 to obtain the content of the programmable data space. The counter value stored in the programming session counter 130 and the invalidation bit 142 (if present) can be read to determine the number of sessions that OTP memory 100 has been programmed, and whether the EDC entries can be used to verify the contents of OTP memory 100. If the invalidation bit is set, then the EDC entries may not be relied upon, and data integrity of OTP memory may not be verifiable. If the invalidation bit is not set, then the software program can determine the valid EDC entry to use based on the number of sessions that OTP memory 100 has been programmed as indicated by the counter value of the programming session counter 130. For example, if the counter value indicates that OTP memory 100 has been programmed over four sessions, then the software program can determine that the error detection code stored in EDC entry 128 is the proper error detection code to use. The software program can then compute a verification error detection code over the contents in the first set of data bits 150, and compare the computed verification error detection code with the error detection code read from EDC entry 128. If the two EDC code matches, then the contents of OTP memory 100 can be verified as valid and has not been altered. If the two EDC code mismatches, then OTP memory 100 may have been subjected to a memory error.

Although FIG. 1 shows the programmable data portions 112-118, EDC entries 122-128, programming session counter 130, and invalidation bit 142 being stored and arranged in OTP memory 100 in a certain manner, these data elements of the OTP memory can be arranged differently in other implementations. FIGS. 2-7 illustrate additional examples of how these data elements can be stored in an OTP memory. It should be understood that other variations are possible, and that the specific arrangement of the data elements is not limited to what is shown.

Figure 2:
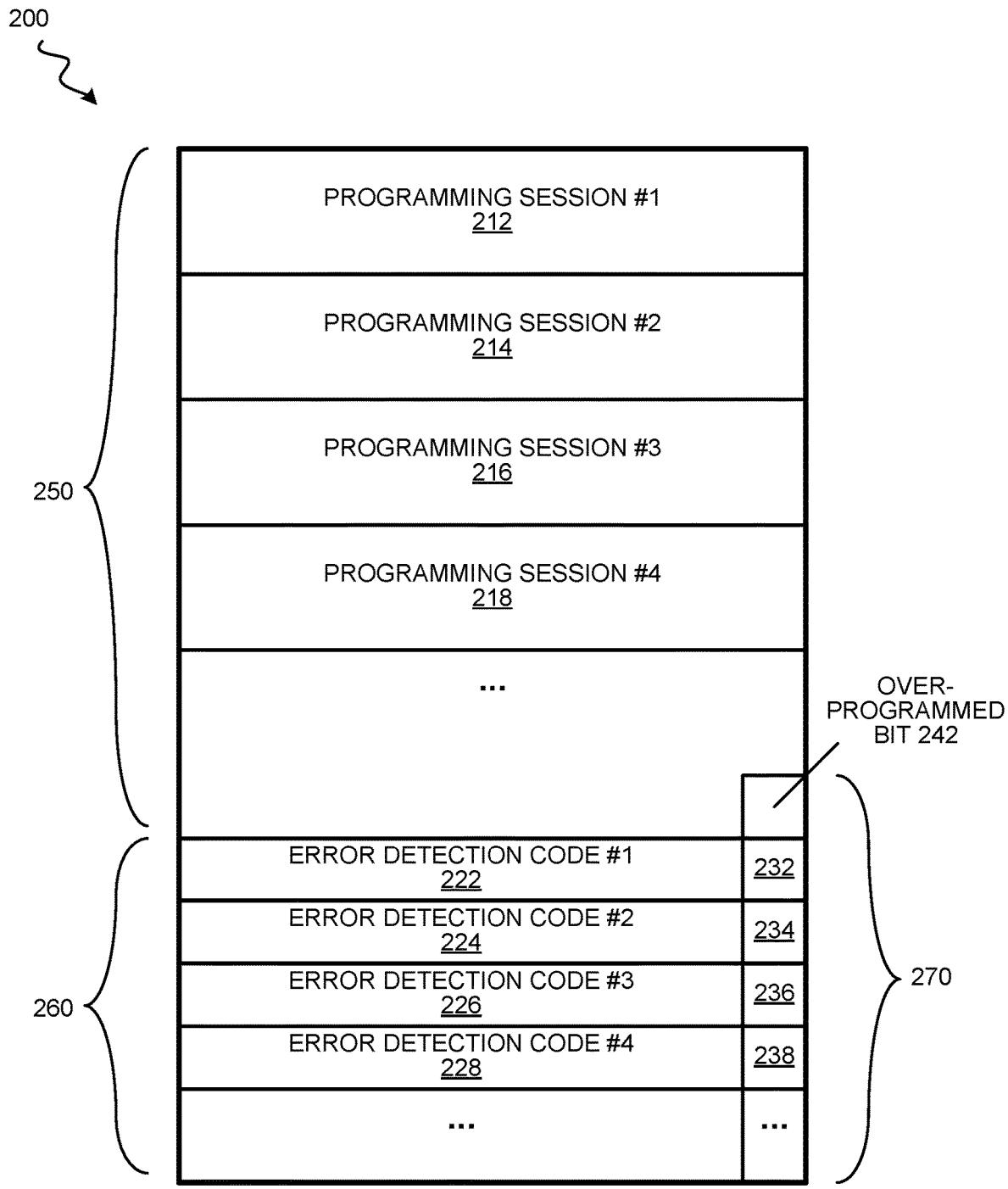
FIG. 2 illustrates a block diagram of another example of an OTP memory.

FIG. 2 illustrates a block diagram of another example of an OTP memory 200. The content of OTP memory 200 is similar to that of OTP memory 100. OTP memory 200 includes a first set of data bits 250 to store programmable data that is programmed over a number of programming sessions, a second set of data bits to store multiple error detection code (EDC) entries (e.g., one EDC entry per programming session), and a third set of data bits 270 to store a counter value indicating the number of sessions that OTP memory 200 has been programmed as well as an invalidation bit 242. The functionalities of OTP memory 200 and the information stored therein are similar to that of OTP memory 100, and thus a detailed description of which need not be repeated.

OTP memory 200 differs from OTP memory 100 in that the counter data bits 232, 234, 236, 238, etc. for storing the counter value are each appended to a corresponding EDC entry. In this context, each counter data bit can be used to indicate whether the corresponding EDC entry has been programmed, and the last EDC entry having the corresponding counter data bit set is the proper EDC entry to use to verify the data integrity of OTP memory 200.

For example, suppose OTP memory 200 has been subjected to two programming sessions. During the first programming session, data portion 212 is programmed with input data, EDC entry 222 is programmed with an error detection code computed over the first set of data bits 250 (programmed data in portion 212 and unprogrammed data in remainder of the first set of data bits 250), and counter data bit 232 is set to indicate OTP memory 200 has been programmed once. During the second programming session, data portion 214 is programmed with input data, EDC entry 224 is programmed with an error detection code computed over the first set of data bits 250 (programmed data in portions 212 and 214, and unprogrammed data in remainder of the first set of data bits 250), and counter data bit 234 is set to indicate OTP memory 200 has been programmed twice.

Following the two programming sessions, when the content of OTP memory 200 is read, only counter data bits 232 and 242 would be set to indicate that OTP memory 200 has been programmed twice. Counter data bit 236 corresponding to EDC entry 226 would not be set. This indicates that the proper EDC entry to use to verify the data integrity of OTP memory is EDC entry 224 because this is the last EDC entry whose corresponding counter data bit has been programmed.

Figure 3:
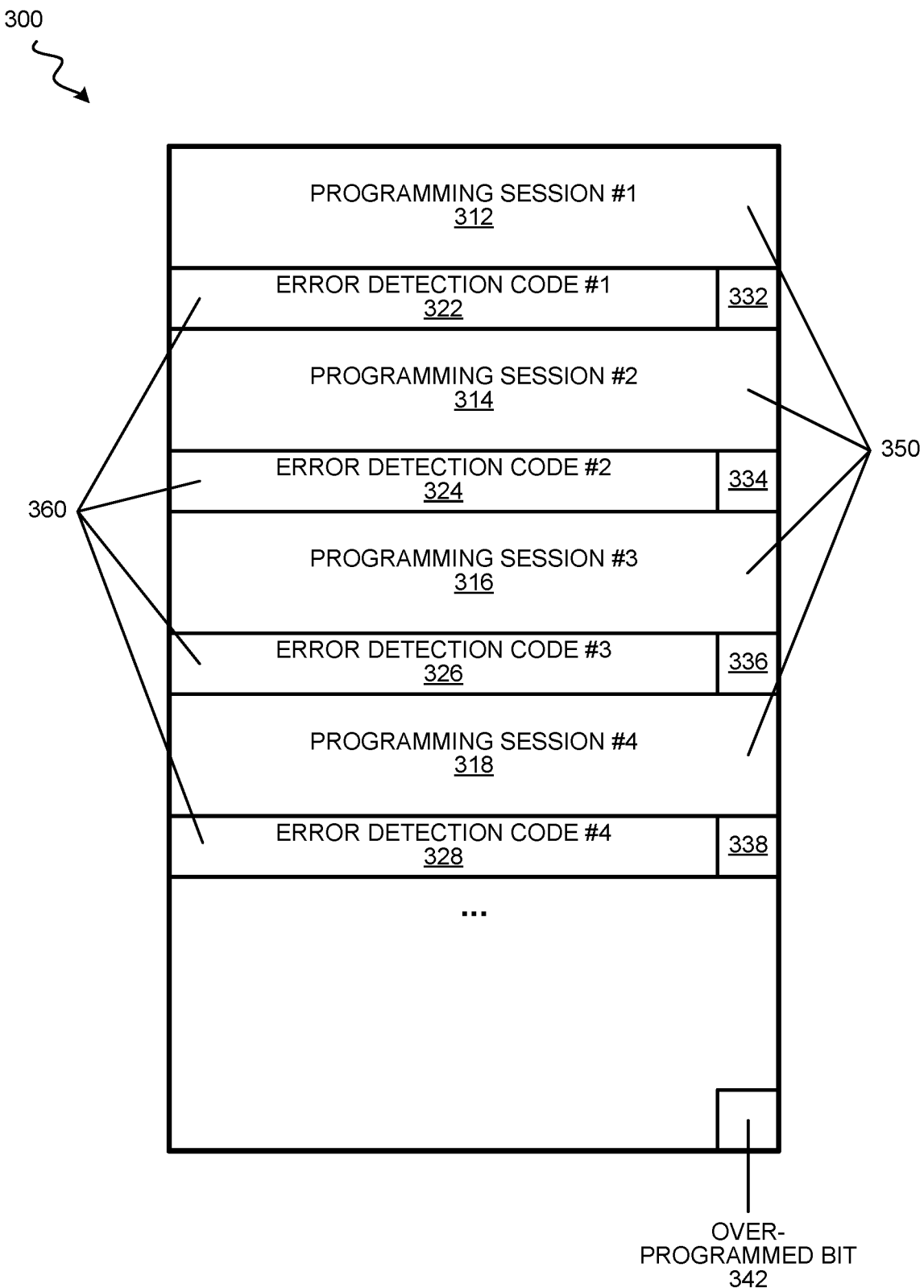
FIG. 3 illustrates a block diagram of an example of an OTP memory with intervening data elements.

FIG. 3 illustrates a block diagram of a further example of an OTP memory 300. The information being stored in OTP memory 300 is similar to that of OTP memory 100, and thus a detailed description of which need not be repeated. Unlike OTP memory 100 in which each of the first set of data bits 150, the second set of data bits 160, and the third set of data bits 170 spans a contiguous section of the memory, the three sets of data bits in OTP memory 300 are non-contiguous. Referring to FIG. 3, OTP memory 300 has a first set of data bits 350 for storing programmable data that includes data portions 312, 314, 316, and 318, a second set of data bits for storing EDC entries that includes EDC entries 322, 324, 326, and 328, and a third set of data bits for storing a counter value that includes counter data bits 332, 334, 336, and 338. Each of data portions in the first set of data bits for storing programmable data is separated by an EDC entry and counter data bit. OTP memory 300 can further include an invalidation bit 342 at a suitable location in the memory (e.g., the last data bit of the memory). Such an arrangement of the data elements may simplify programming of OTP memory 300, because each programming session can sequentially write the input data, error detection code, and corresponding counter data bit together without have to skip over intervening addresses. More generally, one or more of the first set of data bits for storing programmable data, the second set of data bits for storing EDC entries, and the third set of data bits for storing the counter value can be non-contiguous.

Figure 4:
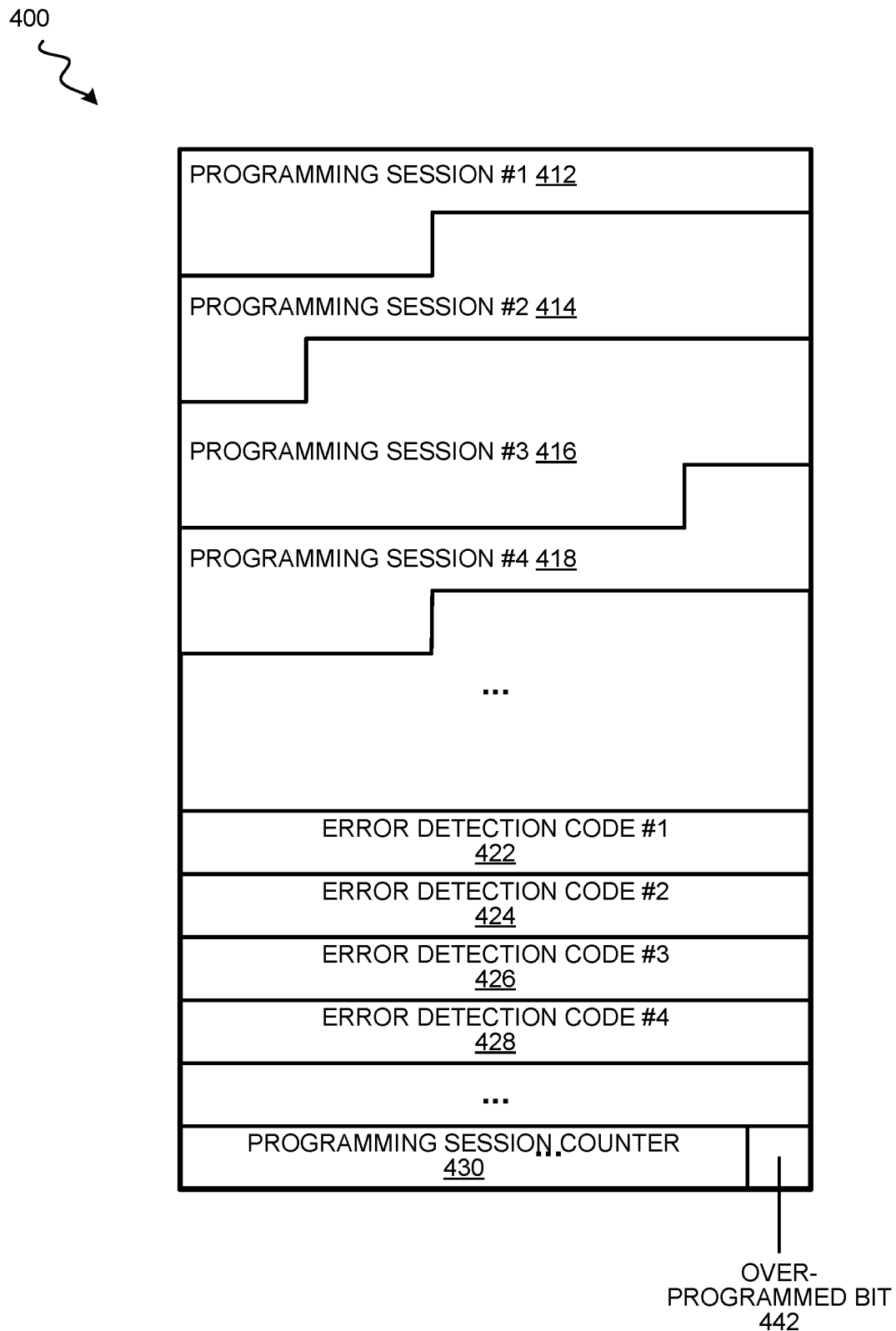
FIG. 4 illustrates a block diagram of an example of an OTP memory that minimizes unused data bits.

FIG. 4 illustrates a block diagram of another implementation of an OTP memory 400. The information being stored in OTP memory 400 is similar to that of OTP memory 100, and thus a detailed description of which need not be repeated. In prior examples of the OTP memory shown thus far, the beginning of the programmable data for each programming session is aligned to the first column of the memory. However, it is not necessary for the programmable data to be aligned as such. Furthermore, the amount of programmable data written during each programming session may vary. Thus, to maximize utilization of the memory, OTP memory 400 utilizes data portions for corresponding programming sessions that may not necessarily be aligned with the column width of the memory. Instead, each successive programming session writes the programmable data immediately following the last data written by the previous programming session. This allows the programmable data to be written into OTP memory in a more compact fashion and eliminates unused data bits between the data written by successive programming sessions.

Figure 5:
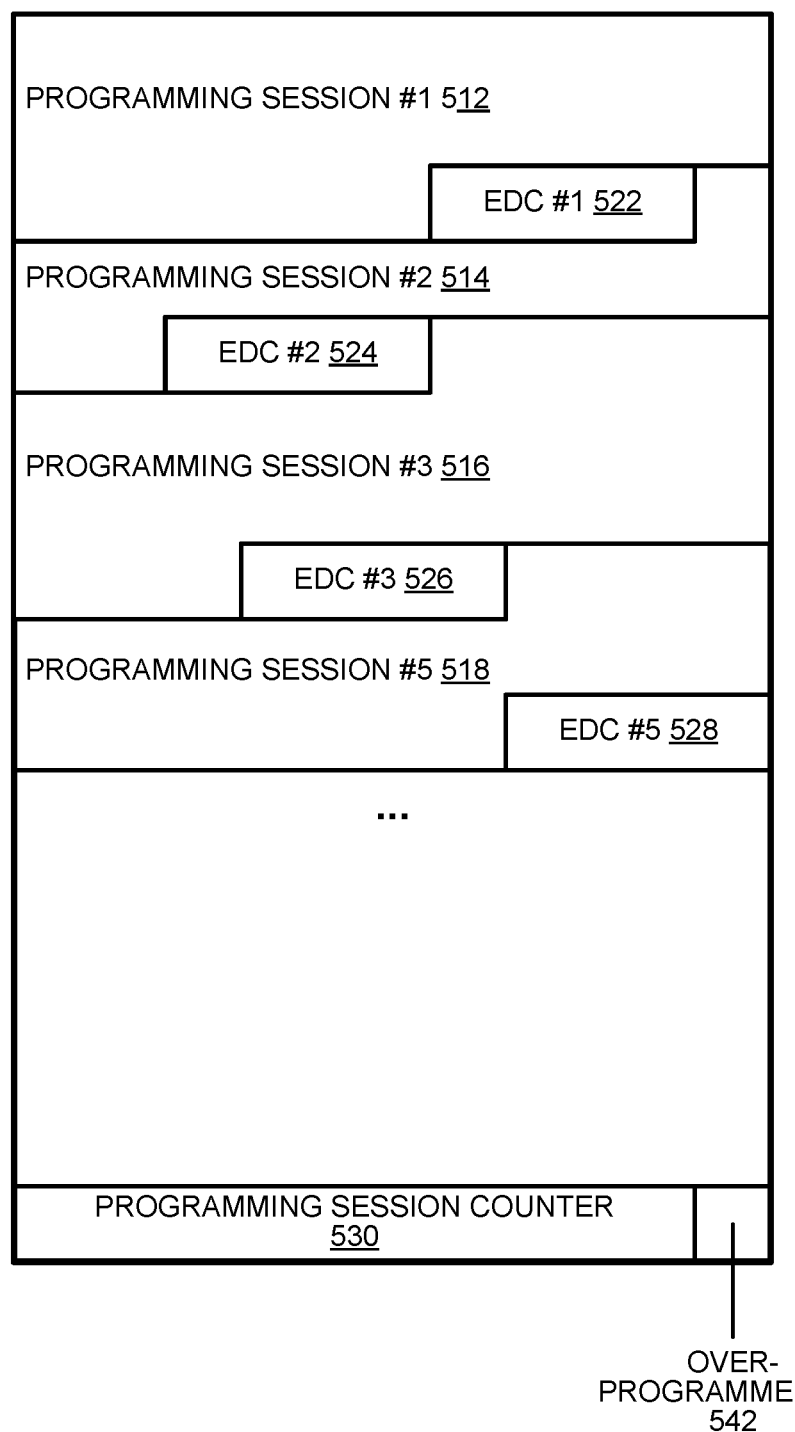
FIG. 5 illustrates a block diagram of another example of an OTP memory that minimizes unused data bits.
Figure 6:
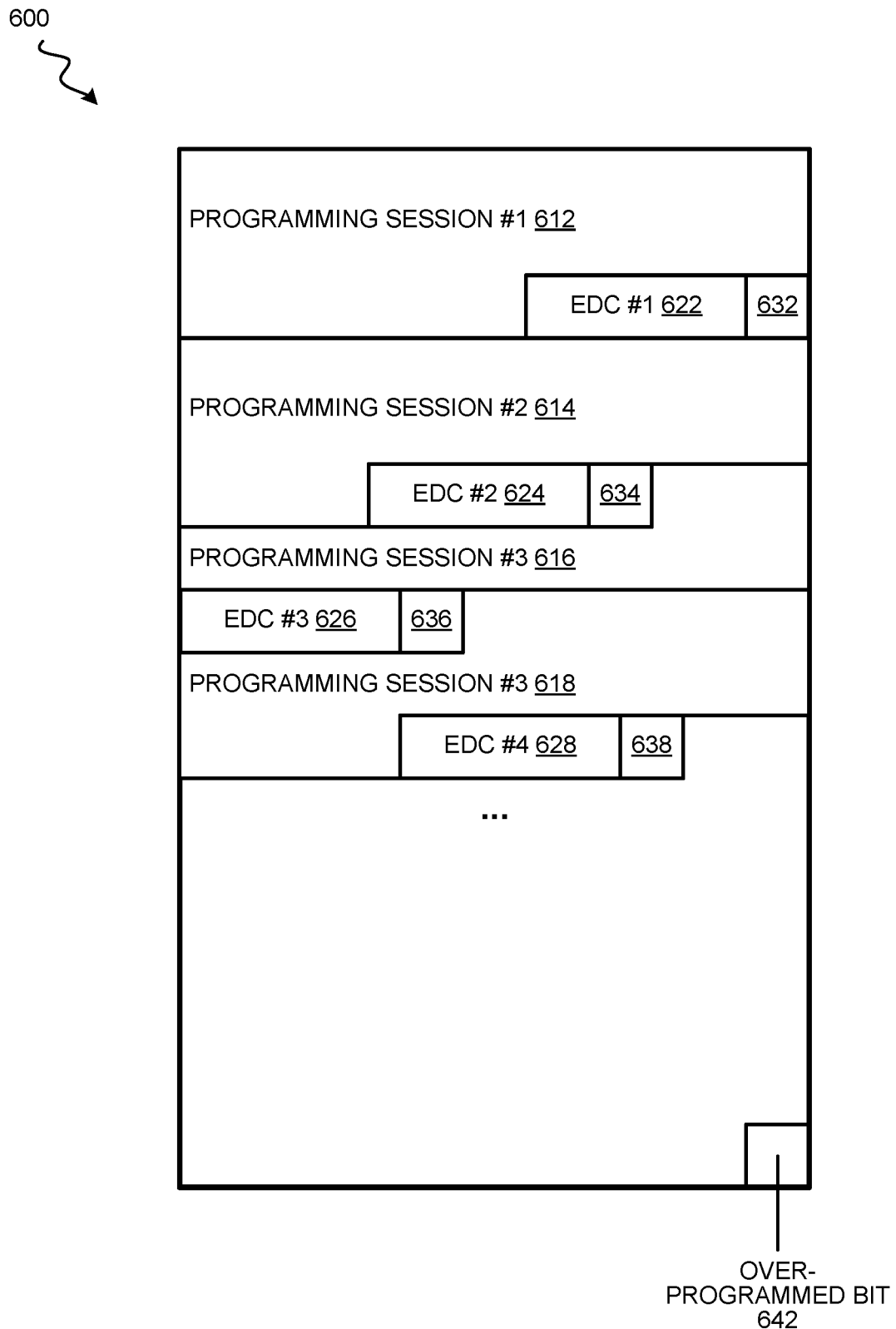
FIG. 6 illustrates a block diagram of a further example of an OTP memory that minimizes unused data bits.

FIGS. 5-6 each illustrates a block diagram of a variation of OTP memory 400. Referring to FIG. 5, OTP memory 500 is similar to OTP memory 400 in that the beginning of the programmable data for each programming session is not necessarily aligned to the first column of the memory. In OTP memory 500, the EDC entry for a corresponding programming session follows the programmable data, and each successive programming session writes the programmable data immediately following the EDC entry of the previous programming session. Referring to FIG. 6, OTP memory 600 is also similar to OTP memory 400 in that the beginning of the programmable data for each programming session is not necessarily aligned to the first column of the memory. In OTP memory 600, the EDC entry for the corresponding programming session follows the programmable data, and the counter data bit follows the EDC entry. Each successive programming session writes the programmable data immediately following the counter data bit of the previous programming session. Any of the implementations shown in FIGS. 4-6 can be used to maximize the utilization of the OTP memory.

Figure 7:
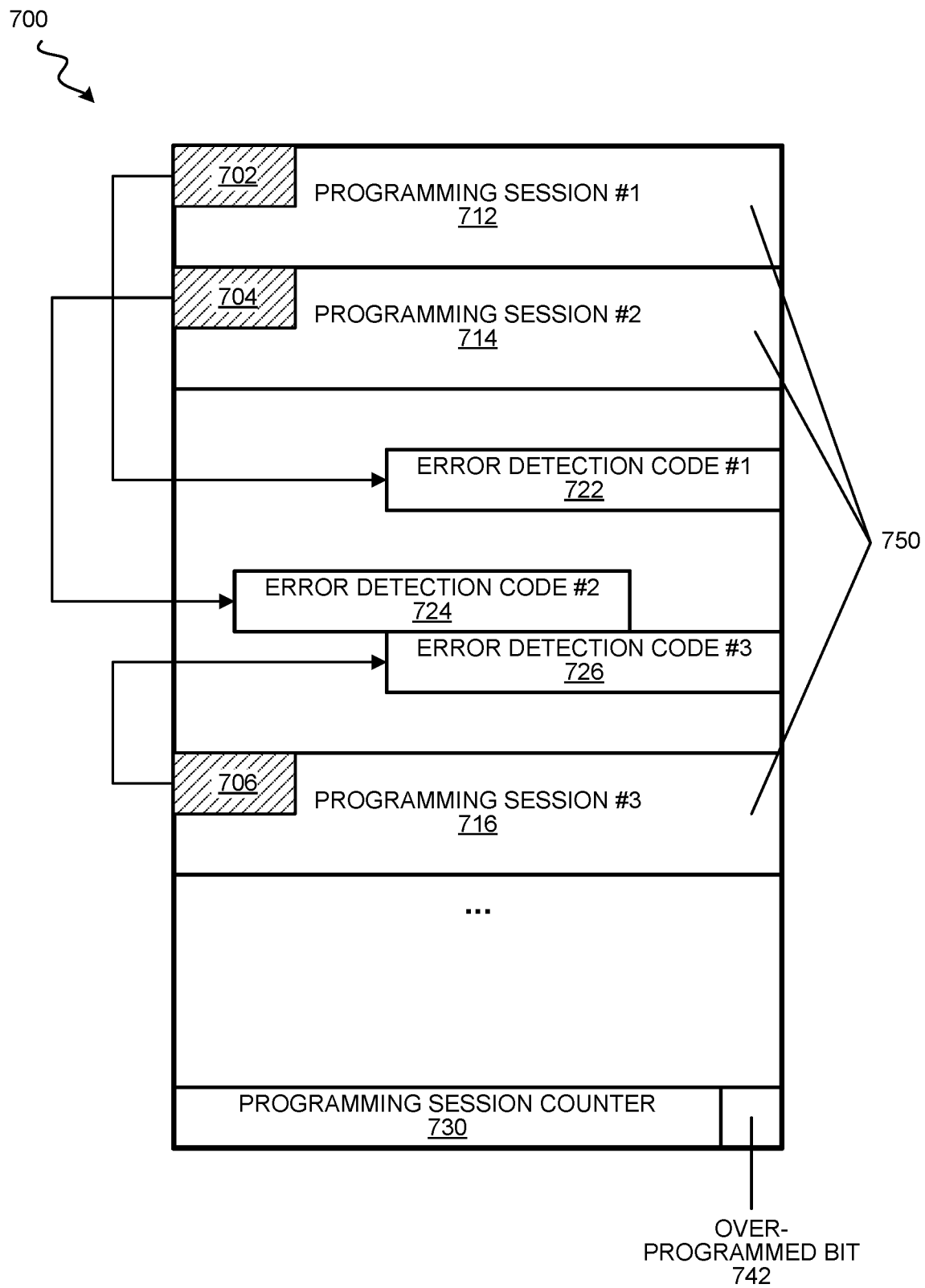
FIG. 7 illustrates a block diagram of an example of an OTP memory that stores location information of data elements.

FIG. 7 illustrates a block diagram of another implementation of an OTP memory 700. As mentioned above, in some implementations, the locations of certain data elements can be stored directly in the OTP memory itself. OTP memory 700 is an example where the locations of the EDC entries are stored as part of the programmable data in the memory itself. As shown in FIG. 7, the first data portion 712 for storing the programmable data of the first programming session may include a pointer 702 (e.g., a memory address or offset) indicating a location of the EDC entry 722 corresponding to the first programming session. The second data portion 714 for storing the programmable data of the second programming session may include a pointer 704 indicating a location of the EDC entry 724 corresponding to the second programming session. The third data portion 716 for storing the programmable data of the third programming session may include a pointer 706 indicating a location of the EDC entry 726 corresponding to the third programming session. Although pointers 702, 704, and 706 are shown as being stored at the beginning of their respective data portions, the pointers indicating the locations of data elements can be stored elsewhere in the data portions or separately from the data portions.

During the data integrity check of OTP memory 700, the number of sessions that OTP memory 700 has been programmed can be determined from the counter value stored in programming session counter 730. The memory location of the proper EDC entry to use for data integrity check can be extracted from the programmable space 750 based on the number of sessions that OTP memory 700 has been programmed. For example, if OTP memory 700 has been programmed over three sessions, then the location of the proper EDC entry can be obtained by reading pointer 706 in data portion 716 corresponding to the third programming session. Once the memory location of the proper EDC entry is determined, the error correction code from the proper EDC entry can be read and compared with a verification error correction code computed over the data read from the programmable space 750 to determine the data integrity of OTP memory 700.

Figure 8:
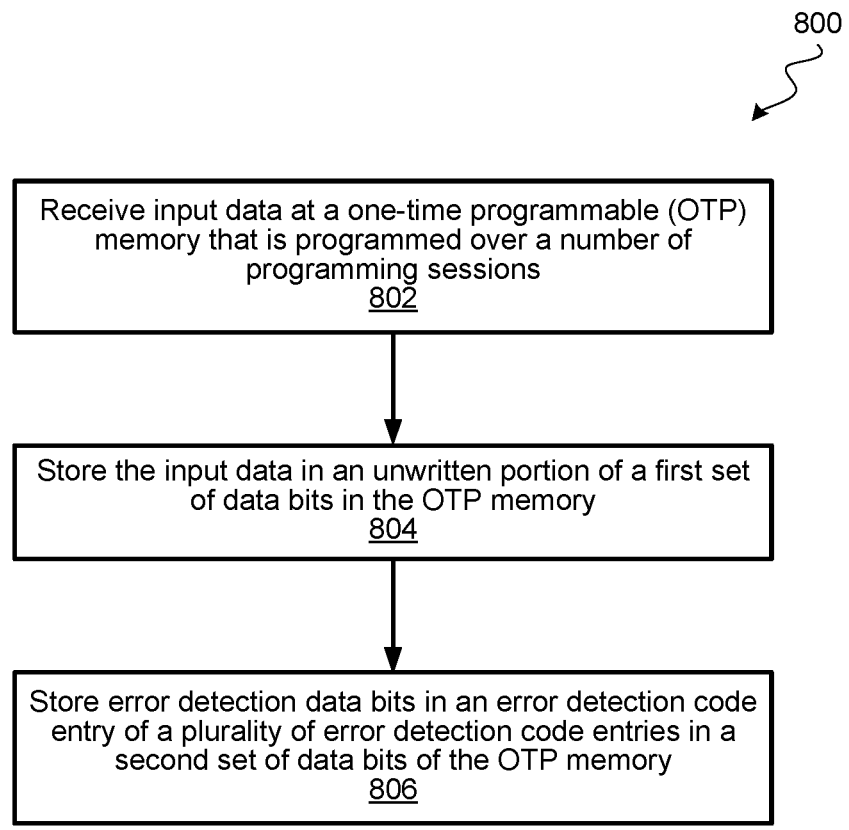
FIG. 8 illustrates a flow diagram of an example of a process for providing a data integrity check in an OTP memory.

FIG. 8 illustrates a flow diagram of an example of a process 800 that can be performed by an OTP memory to provide data integrity check on the OTP memory. Process 800 may begin at block 802 by receiving input data at the OTP memory that is programmed over a number of programming sessions. Although the data bits of an OTP memory can only be programmed once, the OTP memory may nevertheless be programmed over a number of programming sessions in which each programming session writes a different portion of the memory. This may occur, for example, when multiple entities are tasked with programming different information onto the OTP memory. The programming can be performed, for example, by using a programming card that is capable of applying a high voltage to the OTP memory. In some implementations, the programming can also be performed in the field by using on-chip or on-board high voltage generators.

At block 804, the OTP memory may store the input data in an unwritten portion of a first set of data bits in the OTP memory. In some implementations, each programming session can be assigned a data portion in the OTP memory, and the input data for a particular programming session is written into its assigned data portion. In some implementations in which each successive programming session writes data into the OTP memory following the last data written by the previous programming session, the OTP memory can be read to determine the last location written by the previous programming session if the amount of data written by the previous programming session is not known by the programming entity. The input data can then be written into the next available location.

At block 806, the OTP memory may store error detection data bits in an unused error detection code entry in a second set of data bits of the OTP memory that is used to hold multiple error detection code entries. Each of error detection code entries in the second set of data bits of the OTP memory is configured to store an error detection code computed over the first set of data bits for a corresponding programming session. The error detection code can be, for example, a CRC value, a checksum value, a hash value, an error correction code, etc. The error detection code (EDC) can be received as an input provided by the programming entity, or can be computed, for example, by software executing on the computing system that is programming the OTP memory. In some implementations, each programming session can be assigned an EDC entry in the OTP memory, and the error detection data bits for a particular programming session is written into its assigned EDC entry. In some implementations, the error detection data bits can be programmed into the OTP memory following the input data from block 804.

The data integrity of the OTP memory is determined by verifying the error detection code entry corresponding to the number of sessions that the OTP memory has been programmed. For example, if the OTP memory has been subjected to ten programming sessions, then the data integrity of the OTP memory is determined by verifying the error detection code entry that was written during the tenth programming session. To facilitate the data integrity check process, in addition to storing the EDC entries, the OTP memory can store a counter value representing the number of sessions that the OTP memory has been programmed in a third set of data bits of the OTP memory. During the data integrity check process, the counter value can be read to determine the number of sessions the OTP memory has been programmed, and hence which EDC entry in the OTP memory is the proper entry to verify. In some implementations, the OTP memory can also store an invalidation bit which is used to indicate whether the content of the OTP memory is verifiable with the EDC entries stored therein. The EDC entries in the OTP memory can be invalid, for example, if the number of sessions that the OTP memory has been programmed exceeds the number of available EDC entries, or if a memory error has been detected for the OTP memory.

Figure 9:
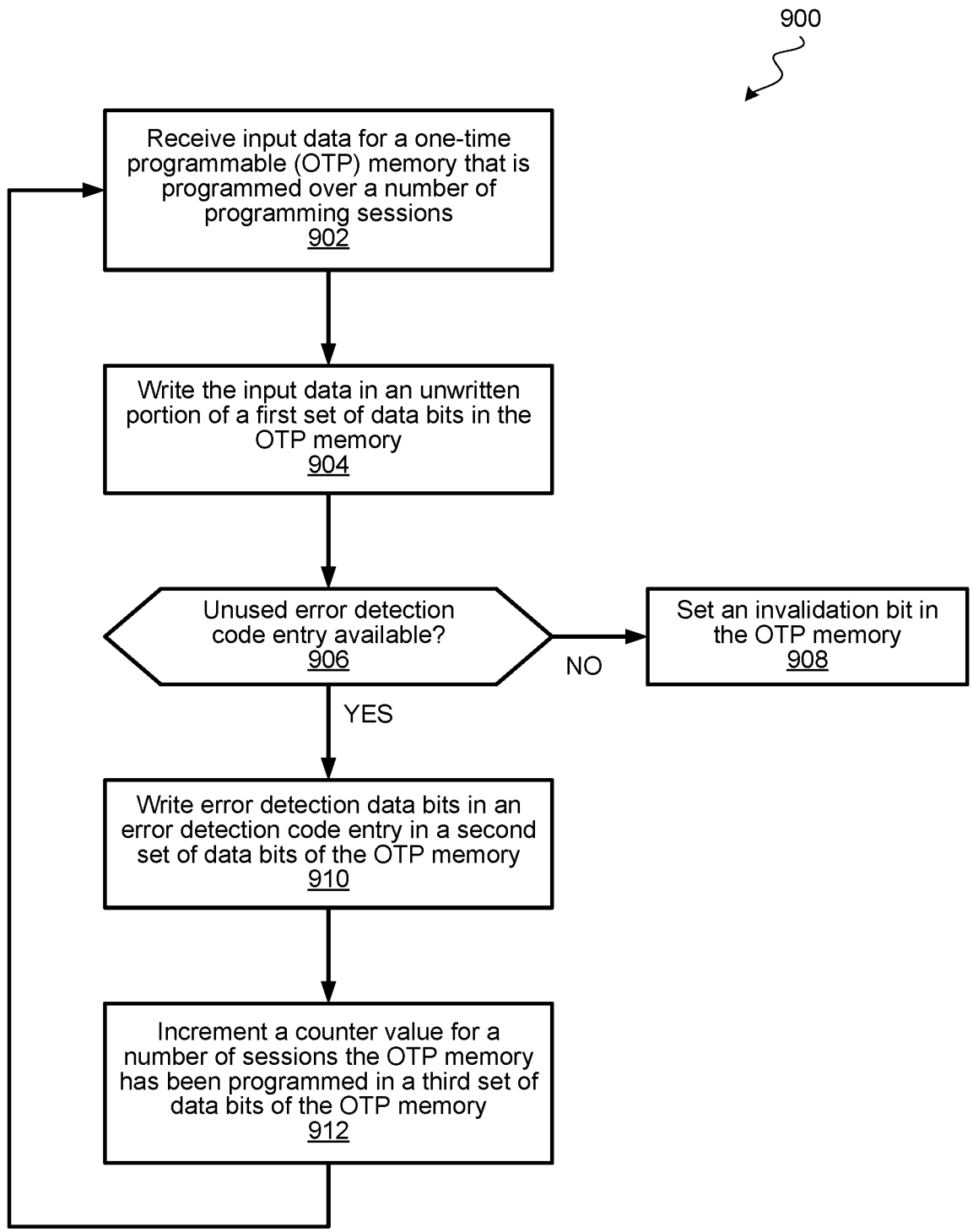
FIG. 9 illustrates a flow diagram of an example of a process for programming an OTP memory.

FIG. 9 illustrates a flow diagram of an example of a process 900 that can be performed, for example, by software executing on a computing system being used to program an OTP memory, a memory controller, or other memory programming tool or entity. Process 900 may begin at block 902 by receiving input data for the OTP memory that is programmed over a number of programming sessions. The input data can be, for example, a serial number, a part number, a revision number, a manufacturing date, a media access control address, a cryptographic key, etc., and such information can be provided by a programming entity such as a manufacturer or OEM, etc.

At block 904, process 900 can write the input data in an unwritten portion of a first set of data bits in the OTP memory. The OTP memory can be written by performing one or more write accesses with a memory location (e.g., memory address) in the OTP memory to store the input data. In some implementations, each programming session can be assigned a data portion in the OTP memory, and the input data for a particular programming session is written into its assigned data portion. In some implementations in which each successive programming session writes data into the OTP memory following the last data written by the previous programming session, the OTP memory can be read to determine the last location written by the previous programming session if the amount of data written by the previous programming session is not known by the programming entity. The input data can then be written into the next available location.

At block 906, process 900 can determine whether an unused error detection entry is available in the OTP memory. This determination can be made, for example, by reading the counter value in the programming session counter in the OTP memory to determine if the counter has reached its maximum value, or reading the EDC entries of the OTP memory to determine if any of the entries remains unused. In some implementations in which the EDC entries are not assigned to any particular location (e.g., when the EDC is written at the end of the programmable data of a programming session), this determination can be made by reading the OTP memory to determine if there is sufficient unused space in the OTP memory to store the EDC entry.

At block 908, if it is determined that there are no unused EDC entries left on the OTP memory, process 900 can set an invalidation bit in the OTP memory to indicate that the number of sessions that the OTP has been programmed exceeds the number of EDC entries. In such scenarios, the EDC entries in the OTP memory cannot be relied upon for data integrity check. Components that access the information stored in the OTP memory can use this invalidation bit as an indication that the content of the OTP memory cannot be verified and may potentially contain a memory error.

At block 910, if it is determined that an unused EDC entry is available, process 900 can write an error detection code in the unused EDC entry in a second set of data bits of the OTP memory. In some implementations, block 910 may include computing the error detection code over the first set of data bits in the OTP memory. In some implementations, the error detection code can be received as an input. The error detection code can be written, for example, to an assigned location in the OTP memory or following the input data from block 904.

At block 912, a counter value representing the number of sessions that the OTP memory has been programmed is incremented. The counter value can be implemented using the one data bit per programming session. As such, incrementing the counter value can be done by programming or setting the counter data bit corresponding to the current programming session. The counter data bit can be stored, for example, at an assigned location in the OTP memory or following EDC being written at block 910. Process 900 can repeat until the maximum number of programming sessions for the OTP memory has been reached, or until there is no space left on the OTP memory.

Figure 10:
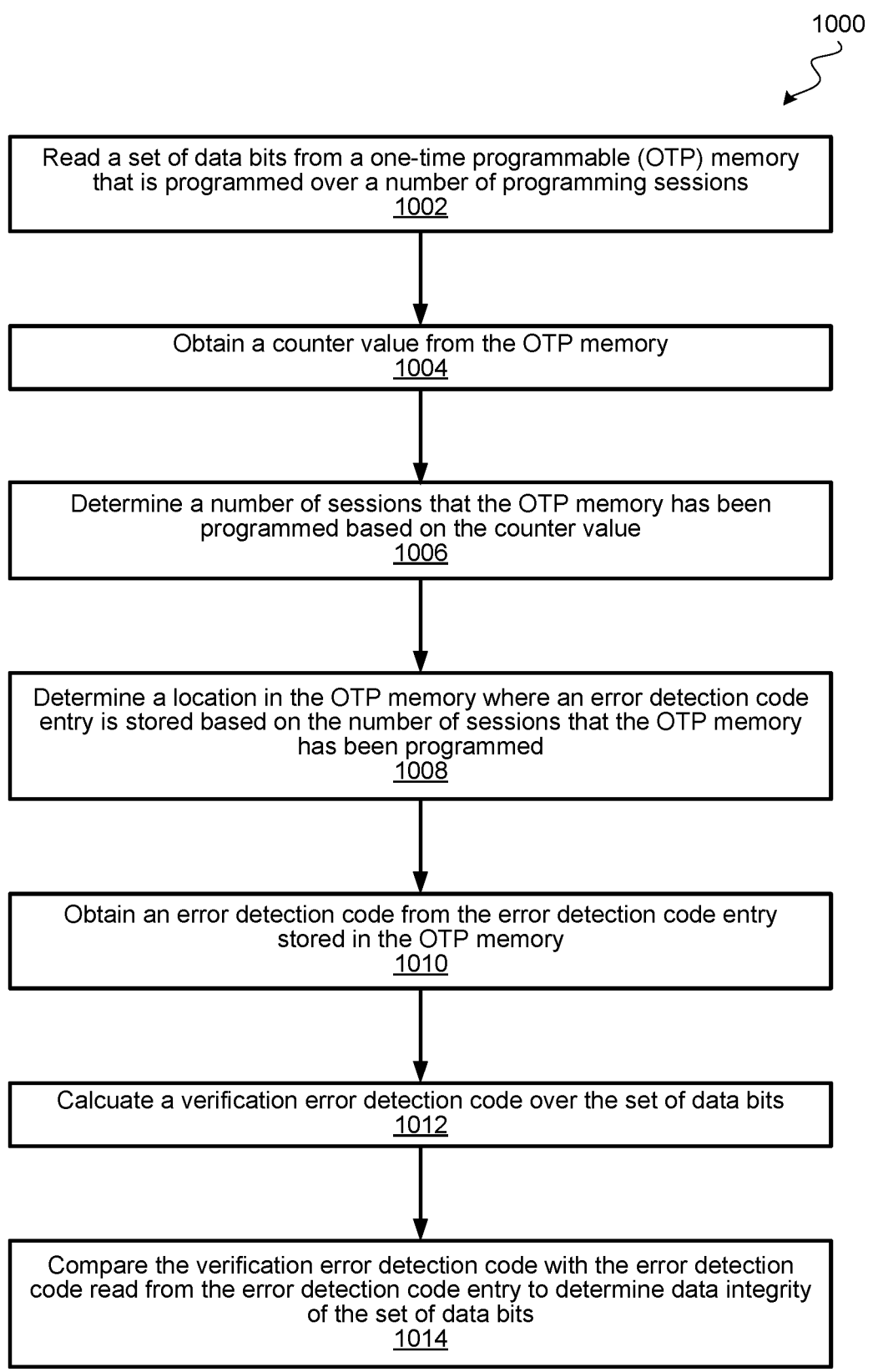
FIG. 10 illustrates a flow diagram of an example of a process for verifying the data integrity of an OTP memory.

FIG. 10 illustrates a flow diagram of an example of a process 1000 that can be performed, for example, by software executing on a computing system being used to verify the content of an OTP memory, a memory controller, or other component or tool accessing the contents of the OTP memory. Process 1000 may begin at block 1002 by reading a set of data bits storing programmable data from an OTP memory that is programmed over a number of programming sessions. The set of data bits storing the programmable data can be contiguous or non-contiguous, and can be read using multiple read accesses to the OTP memory. In implementations in which the set of data bits storing the programmable data is non-contiguous, the read performed in block 1002 may read additional data elements such as error correction codes and counter data bits if such data elements intervene the programmable data written during different programming sessions.

At block 1004, a counter value is obtained from the OTP memory. The counter value represents the number of sessions that the OTP memory has been programmed, and can be implemented using one counter data bit per programming session. Thus, if the OTP memory is expected to be programmed over twelve programming sessions, then the counter value can be implemented using twelve counter data bits. The counter data bits can also be contiguous or non-contiguous, and can be obtained as part of the read performed in block 1002 or be read separately from the OTP memory.

At block 1006, the number of sessions that the OTP memory has been programmed can be determined based on the counter value. For example, if the counter value is implemented using one counter data bit per programming session, then the number of sessions that the OTP memory has been programmed is equal to the number of counter data bits that have been set.

At block 1008, the location of the error detection code entry that should be used for the data integrity check of the OTP memory is determined based on the number of sessions that the OTP memory has been programmed. For example, if the number of sessions that the OTP memory has been programmed is determined to be four, then the fourth error detection code entry should be used for the data integrity check of the OTP memory. The location of the error detection code entry can be, for example, hardcoded into the software program performing process 1000, or by obtaining the location from a mapping of locations to data elements. In some implementations, a pointer to the location can be stored in the OTP memory itself, and the location can be determined by obtaining the pointer corresponding to the proper EDC entry from the OTP memory.

At block 1010, the error detection code stored at the location of the EDC entry determined in block 1008 is obtained. In some implementations, the location in the OTP memory may have already been read when as part of the read performed in block 1002. This may occur, for example, if the EDC entries stored in an intervening manner with the programmable data. In such scenarios, the error detection code can be parsed from the data already read from the OTP memory. In implementations in which the EDC entries are stored separately from the programmable data, the error detection code can be obtained by performing a read access to the location in the OTP memory.

At block 1012, a verification error detection code is computed over the set of data bits storing the programmable data read in block 1002. The computation is carried out using the same algorithm that was used when generated the error detection code stored in the OTP memory. Thus, if the errored detection code stored in the OTP memory is a CRC value, then the same CRC algorithm is used for the computation in block 1012.

At block 1014, the verification error detection code computed in block 1012 is compared with the error detection code read from the EDC entry in block 1010 to determine the data integrity of the set of data bits storing the programmable data. If the verification error detection code computed in block 1012 matches the error detection code read from the EDC entry in block 1010, then process 1000 can verify that the contents of the OTP memory has not been altered. If the verification error detection code mismatches the error detection code read from the EDC entry, then a memory error may have occurred in the OTP memory.

In some implementations, process 1000 can also read an invalidation bit from the OTP memory prior to verifying the error detection code if the OTP contains such a bit. In such implementations, if the invalidation bit is set in the OTP memory, the error detection code verification process can be aborted, because the EDC entries should not be used to verify the data integrity of the OTP memory. This may occur, for example, if the number of sessions that the OTP memory has been programmed exceeds the number of available EDC entries in the OTP memory.

In some implementations, the combination of multiple data entries and a counter value can be used by the OTP memory to emulate a rewritable memory. For instance, the OTP memory may include a first set of data bits configured to store multiple data entries. Each of the data entries can be used to store information that is updated by a successive programming session. The OTP memory also includes a second set of data bits configured to store a counter value representing the number of sessions that the OTP memory has been programmed. Hence, the counter value can be used to indicate which of the data entries is the most-recently updated data entry.

By way of example, some applications may store a timestamp of the latest occurrence of a certain event. Each of the data entries can be used to store a timestamp indicating the time that the event occurred. When a new occurrence of the event is encountered, the timestamp of the event can be programmed into an unwritten data entry. When the timestamp of the latest occurrence of the event is needed, the counter value can be read to determine the number of sessions that the OTP memory has been programmed. The data associated with the latest programming session can then be obtained by using the counter value to determine which of the data entries is the most recent entry. In this manner, the OTP memory can behave like a rewritable memory by indicating which portion of the memory is storing the latest information.

Figure 11:
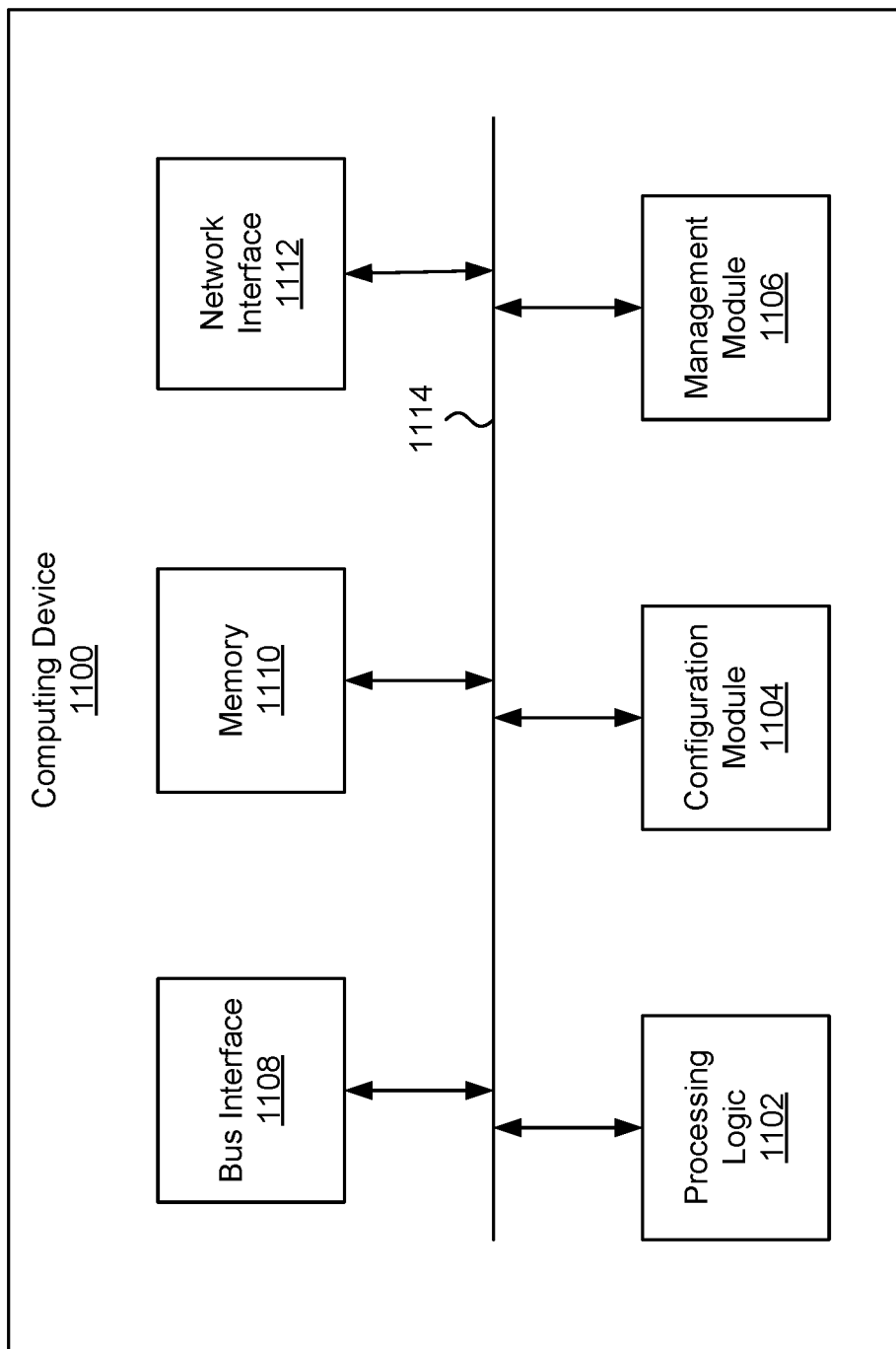
FIG. 11 illustrates a block diagram of an example of a computing device, according to certain aspects of the disclosure.

FIG. 11 illustrates an example of a computing device 1100. Functionality and/or several components of the computing device 1100 may be used without limitation with other embodiments disclosed elsewhere in this disclosure, without limitations. A computing device 1100 may facilitate processing of data, and may include processing packets and/or forwarding of packets from the computing device 1100 to another device. As referred to herein, a "packet" or "network packet" may refer to a variable or fixed unit of data. In some instances, a packet may include a packet header and a packet payload. The packet header may include information associated with the packet, such as the source, destination, quality of service parameters, length, protocol, routing labels, error correction information, etc. In certain implementations, one packet header may indicate information associated with a series of packets, such as a burst transaction. In some implementations, the computing device 1100 may be the recipient and/or generator of packets. In some implementations, the computing device 1100 may modify the contents of the packet before forwarding the packet to another device. The computing device 1100 may be a peripheral device coupled to another computer device, a switch, a router or any other suitable device enabled for receiving and forwarding packets.

In one example, the computing device 1100 may include processing logic 1102, a configuration module 1104, a management module 1106, a bus interface module 1108, memory 1110, and a network interface module 1112. These modules may be hardware modules, software modules, or a combination of hardware and software. In certain instances, modules may be interchangeably used with components or engines, without deviating from the scope of the disclosure. The computing device 1100 may include additional modules not illustrated here. In some implementations, the computing device 1100 may include fewer modules. In some implementations, one or more of the modules may be combined into one module. One or more of the modules may be in communication with each other over a communication channel 1114. The communication channel 1114 may include one or more busses, meshes, matrices, fabrics, a combination of these communication channels, or some other suitable communication channel.

The processing logic 1102 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 1102 may include processors developed by ARM®, MIPS®, AMD®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 1102 may be stored on a computer-readable storage medium, for example, in the form of a computer program. The computer-readable storage medium may be non-transitory. In some cases, the computer-readable medium may be part of the memory 1110.

The memory 1110 may include either volatile or non-volatile, or both volatile and non-volatile types of memory. In some implementations, memory 1110 may include an OTP memory as described herein. The memory 1110 may, for example, include random access memory (RAM), read only memory (ROM), Electrically Erasable Programmable Read-Only Memory (EEPROM), flash memory, and/or some other suitable storage media. In some cases, some or all of the memory 1110 may be internal to the computing device 1100, while in other cases some or all of the memory may be external to the computing device 1100. The memory 1110 may store an operating system comprising executable instructions that, when executed by the processing logic 1102, provides the execution environment for executing instructions providing networking functionality for the computing device 1100. The memory may also store and maintain several data structures and routing tables for facilitating the functionality of the computing device 1100.

In some implementations, the configuration module 1104 may include one or more configuration registers. Configuration registers may control the operations of the computing device 1100. In some implementations, one or more bits in the configuration register can represent certain capabilities of the computing device 1100. Configuration registers may be programmed by instructions executing in the processing logic 1102, and/or by an external entity, such as a host device, an operating system executing on a host device, and/or a remote device. The configuration module 1104 may further include hardware and/or software that control the operations of the computing device 1100.

In some implementations, the management module 1106 may be configured to manage different components of the computing device 1100. In some cases, the management module 1106 may configure one or more bits in one or more configuration registers at power up, to enable or disable certain capabilities of the computing device 1100. In certain implementations, the management module 1106 may use processing resources from the processing logic 1102. In other implementations, the management module 1106 may have processing logic similar to the processing logic 1102, but segmented away or implemented on a different power plane than the processing logic 1102.

The bus interface module 1108 may enable communication with external entities, such as a host device and/or other components in a computing system, over an external communication medium. The bus interface module 1108 may include a physical interface for connecting to a cable, socket, port, or other connection to the external communication medium. The bus interface module 1108 may further include hardware and/or software to manage incoming and outgoing transactions. The bus interface module 1108 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 1108 may include the physical layer for any of these bus protocols, including a connector, power management, and error handling, among other things. In some implementations, the computing device 1100 may include multiple bus interface modules for communicating with multiple external entities. These multiple bus interface modules may implement the same local bus protocol, different local bus protocols, or a combination of the same and different bus protocols.

The network interface module 1112 may include hardware and/or software for communicating with a network. This network interface module 1112 may, for example, include physical connectors or physical ports for wired connection to a network, and/or antennas for wireless communication to a network. The network interface module 1112 may further include hardware and/or software configured to implement a network protocol stack. The network interface module 1112 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing device 1100 may include multiple network interface modules, each configured to communicate with a different network. For example, in these implementations, the computing device 1100 may include a network interface module for communicating with a wired Ethernet network, a wireless 802.11 network, a cellular network, an Infiniband network, etc.

The various components and modules of the computing device 1100, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems In some implementations, the computing device 1100 can be a peripheral device, such as a PCI-based device. In these implementations, the computing device 1100 includes a PCI interface for communicating with a host device. The term "PCI" or "PCI-based" may be used to describe any protocol in the PCI family of bus protocols, including the original PCI standard, PCI-X, Accelerated Graphics Port (AGP), and PCI-Express (PCIe) or any other improvement or derived protocols that are based on the PCI protocols discussed herein. The PCI-based protocols are standard bus protocols for connecting devices, such as a local peripheral device to a host device. A standard bus protocol is a data transfer protocol for which a specification has been defined and adopted by various manufacturers. Manufacturers ensure that compliant devices are compatible with computing systems implementing the bus protocol, and vice versa. As used herein, PCI-based devices also include devices that communicate using Non-Volatile Memory Express (NVMe). NVMe is a device interface specification for accessing non-volatile storage media attached to a computing system using PCIe. For example, the bus interface module 1108 may implement NVMe, and the network device $$$24 may be connected to a computing system using a PCIe interface.

A PCI-based device may include one or more functions. A "function" describes operations that may be provided by the computing device 1100. Examples of functions include mass storage controllers, network controllers, display controllers, memory controllers, serial bus controllers, wireless controllers, and encryption and decryption controllers, among others. In some cases, a PCI-based device may include more than one function. For example, a PCI-based device may provide a mass storage controller and a network adapter. As another example, a PCI-based device may provide two storage controllers, to control two different storage resources. In some implementations, a PCI-based device may have up to eight functions.

In some implementations, the computing device 1100 may include single-root I/O virtualization (SR-IOV). SR-IOV is an extended capability that may be included in a PCI-based device. SR-IOV allows a physical resource (e.g., a single network interface controller) to appear as multiple resources (e.g., sixty-four network interface controllers). Thus, a PCI-based device providing a certain functionality (e.g., a network interface controller) may appear to a device making use of the PCI-based device to be multiple devices providing the same functionality. The functions of an SR-IOV-capable storage adapter device may be classified as physical functions (PFs) or virtual functions (VFs). Physical functions are fully featured functions of the device that can be discovered, managed, and manipulated. Physical functions have configuration resources that can be used to configure or control the storage adapter device. Physical functions include the same configuration address space and memory address space that a non-virtualized device would have. A physical function may have a number of virtual functions associated with it. Virtual functions are similar to physical functions, but are light-weight functions that may generally lack configuration resources, and are generally controlled by the configuration of their underlying physical functions. Each of the physical functions and/or virtual functions may be assigned to a respective thread of execution (such as for example, a virtual machine) running on a host device.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested herein and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A method for providing data integrity checks in a one-time programmable (OTP) memory that is programmed over a number of programming sessions, wherein the OTP memory includes a first set of data bits configured to store programmable data, a second set of data bits configured to store a number of cyclic redundancy check (CRC) entries equal to the number of programming sessions, and a third set of data bits configured to store a counter value representing a number of sessions that the OTP memory has been programmed, the method comprising:
  for each programming session of the OTP memory:
    storing input data in an unwritten portion of the first set of data bits;
    storing a CRC value in an unused CRC entry in the second set of data bits, the CRC value being computed over the first set of data bits; and
    incrementing the counter value in the third set of data bits,
  wherein data integrity of the OTP memory is verified by:
    reading the first set of data bits from the OTP memory;
    reading the counter value to determine the number of sessions that the OTP memory has been programmed;
    reading a stored CRC value in the CRC entry corresponding to the number of sessions that the OTP memory has been programmed; and
    verifying that the stored CRC value is computed over the first set of data bits read from the OTP memory.

2. The method of claim 1, wherein the counter value represents the number of sessions that the OTP memory has been programmed as ($2^n-1$), where n is the number of sessions that the OTP memory has been programmed.

3. The method of claim 2, wherein the third set of data bits further includes an invalidation bit indicating whether the number of sessions that the OTP memory has been programmed exceeds the number of CRC entries.

4. The method of claim 1, wherein the first set of data bits, the second set of data bits, or the third set of data bits is non-contiguous.

5. A one-time programmable (OTP) memory comprising:
  a first set of data bits configured to store programmable data associated with a number of programming sessions;
  a second set of data bits configured to store a plurality of error detection code entries, wherein each error detection code entry is configured to store an error detection code computed over the first set of data bits for a corresponding programming session; and
  a third set of data bits configured to store a counter value representing a number of sessions that the OTP memory has been programmed.

6. The OTP memory of claim 5, wherein the counter value is implemented using a number of counter data bits being equal to the number of programming sessions.

7. The OTP memory of claim 5, wherein the first set of data bits, the second set of data bits, or the third set of data bits is non-contiguous.

8. The OTP memory of claim 5, wherein each of the first set of data bits, the second set of data bits, and the third set of data bits is contiguous.

9. The OTP memory of claim 5, further comprising an invalidation bit indicating whether data integrity of the OTP memory is verifiable by using the error detection code entries.

10. The OTP memory of claim 5, wherein the programmable data includes manufacturing information, unique device information, or hardware configuration information.

11. The OTP memory of claim 5, wherein the programmable data includes a serial number, a part number, a revision number, a manufacturing date, a media access control address, or a cryptographic key.

12. The OTP memory of claim 5, wherein the programmable data includes a pointer indicating a location of an error detection code entry.

13. The OTP memory of claim 5, wherein the OTP memory is programmed by a plurality of entities.

14. The OTP memory of claim 13, wherein the plurality of entities includes a semiconductor foundry, a semiconductor packaging provider, an original equipment manufacturer, or a system or application provider.

15. A one-time programmable (OTP) memory comprising:
  a first set of data bits configured to store a plurality of data entries, each of the data entries associated with a programming session; and
  a second set of data bits configured to store a counter value representing a number of sessions that the OTP memory has been programmed,
  wherein the counter value indicates which of the plurality of data entries is a most-recently updated data entry.

16. A method comprising:
  receiving input data at a one-time programmable (OTP) memory that is programmed over a number of programming sessions;
  storing the input data in an unwritten portion of a first set of data bits in the OTP memory; and
  storing error detection data bits in an error detection code entry of a plurality of error detection code entries in a second set of data bits of the OTP memory, wherein each error detection code entry is configured to store an error detection code computed over the first set of data bits for a corresponding programming session,
  wherein data integrity of the OTP memory is determined by verifying the error detection code entry corresponding to a number of sessions that the OTP memory has been programmed.

17. The method of claim 16, further comprising:
  storing a counter value representing the number of sessions that the OTP memory has been programmed in a third set of data bits of the OTP memory.

18. The method of claim 17, wherein the counter value is implemented using a number of counter data bits being equal to the number of programming sessions.

19. The method of claim 17, further comprising:
  storing an invalidation bit in the third set of data bits of the OTP memory.

20. A non-transitory computer-readable medium having stored therein instructions that, when executed by one or more processors, cause the one or more processors to perform operations including:

reading a set of data bits from a one-time programmable (OTP) memory that is programmed over a number of programming sessions;

obtaining a counter value from the OTP memory;

determining a number of sessions that the OTP memory has been programmed based on the counter value;

determining a location in the OTP memory where an error detection code entry is stored based on the number of sessions that the OTP memory has been programmed;

obtaining an error detection code from the error detection code entry stored in the OTP memory;

calculating a verification error detection code over the set of data bits; and comparing the verification error detection code with the error detection code read from the error detection code entry to determine data integrity of the set of data bits.

* * * * *